United States Patent
Schaefer

(10) Patent No.: US 8,472,895 B2
(45) Date of Patent: Jun. 25, 2013

(54) METHOD FOR CONTROLLING AN EER POWER AMPLIFIER FOR DIGITAL TRANSMISSION

(75) Inventor: Andreas Schaefer, Bersteland (DE)

(73) Assignee: Deutsche Telekom AG, Bonn (DE)

(*) Notice: Subject to any disclaimer, the term of this patent is extended or adjusted under 35 U.S.C. 154(b) by 1117 days.

(21) Appl. No.: 11/720,767

(22) PCT Filed: Oct. 8, 2005

(86) PCT No.: PCT/DE2005/001806
§ 371 (c)(1),
(2), (4) Date: Sep. 29, 2009

(87) PCT Pub. No.: WO2006/060975
PCT Pub. Date: Jun. 15, 2006

(65) Prior Publication Data
US 2010/0029229 A1    Feb. 4, 2010

(30) Foreign Application Priority Data
Dec. 3, 2004 (DE) .......................... 10 2004 059 088

(51) Int. Cl.
*H04B 1/02* (2006.01)

(52) U.S. Cl.
USPC ............................. 455/108; 455/424; 455/425

(58) Field of Classification Search
USPC ............... 455/424, 425, 456.5, 456.6, 561, 455/550.1, 575.1, 102, 126, 110, 108, 116, 455/127.1, 127.2, 123, 522, 552.1, 138, 67.11, 455/67.16, 136, 147, 180.1, 139, 188.1, 304, 455/114.3, 127.4, 553.1, 118, 114.1; 375/300, 375/302, 305, 271, 274, 298, 306, 307, 376, 375/296, 285, 295, 283, 345, 219, 297; 330/129, 330/282, 141, 281, 149, 136, 151, 124 R, 330/2; 370/205, 347, 344; 331/1 A, 10, 25
See application file for complete search history.

(56) References Cited

U.S. PATENT DOCUMENTS

| 4,317,210 A | * | 2/1982 | Dekker et al. | ................. 375/319 |
| 5,293,406 A | * | 3/1994 | Suzuki | .......................... 375/295 |

(Continued)

FOREIGN PATENT DOCUMENTS

| DE | 19535075 | 4/1996 |
| DE | 10045761 | 3/2002 |

OTHER PUBLICATIONS

Leonard R. Kahn "Single-Sideband Transmission by Envelope Elimination and Resoration", Proceedings of the I.R.E., vol. 40, No. 7, Jul. 1952, pp. 803-805.

(Continued)

*Primary Examiner* — Ajibola Akinyemi
(74) *Attorney, Agent, or Firm* — Leydig, Voit & Mayer, Ltd.

(57) ABSTRACT

A method for controlling power amplifiers for digital transmission includes converting a digital modulation signal according to envelope elimination and restoration into an amplitude signal and into a phase-modulated carrier signal. The amplitude signal and the phase-modulated carrier signal are combined in a final stage so as to provide a transmit signal. The amplitude signal is automatically monitored by a module that employs a distribution-density function of the amplitude signal in order to determine a direct component error of the amplitude signal. The distribution-density function of the amplitude signal corresponds to a Rayleigh function if the energy of the complex modulation signal is distributed approximately uniformly within a bandwidth being used. If the spectral power density has an approximately rectangular form, the Rayleigh function is used to determine the direct component error. The direct component error is determined from the amplitude signal.

2 Claims, 3 Drawing Sheets

U.S. PATENT DOCUMENTS

| | | | |
|---|---|---|---|
| 5,742,201 A * | 4/1998 | Eisenberg et al. | 330/2 |
| 6,653,909 B2 * | 11/2003 | Nielsen | 332/151 |
| 7,230,997 B2 * | 6/2007 | Kurakami et al. | 375/297 |
| 7,242,728 B2 * | 7/2007 | Kanazawa | 375/296 |
| 2003/0118125 A1 * | 6/2003 | Doi | 375/297 |
| 2005/0156662 A1 * | 7/2005 | Raghupathy et al. | 330/10 |
| 2005/0191976 A1 * | 9/2005 | Shakeshaft et al. | 455/118 |
| 2005/0281063 A1 * | 12/2005 | Sointula | 363/63 |
| 2006/0092326 A1 * | 5/2006 | Tanabe | 348/571 |
| 2009/0023402 A1 * | 1/2009 | Shimizu et al. | 455/102 |
| 2011/0148518 A1 * | 6/2011 | Lejon et al. | 330/124 R |

OTHER PUBLICATIONS

S. Mann et al. "Increasing the talk-time of mobile radios with efficient linear transmitter architectures", Electronics and Communication Engineering Journal, institution of Electrical Engineers, London, GB, vol. 13, No. 2, Apr. 2001, XP001055796, pp. 65-76.

Frederick H. Raab et al. "L-Band Transmitter Using Kahn EER Technique", IEE Transactions on Microwave Theory and Techniques, vol. 46, No. 12, Dec. 1998, XP-000805603: pp. 2220-2224.

* cited by examiner

METHOD FOR CONTROLLING AN EER POWER AMPLIFIER FOR DIGITAL TRANSMISSION

CROSS REFERENCE TO RELATED APPLICATIONS

This is a U.S. national phase application under 35 U.S.C. §371 of International Patent Application No. PCT/DE2005/001806, filed Oct. 8, 2005, and claims benefit of German Patent Application No. 10 2004 059 088.5, filed Dec. 3, 2004, which is incorporated by reference herein. The Internation Application was published in German on Jun. 15, 2006 as WO 2006/060975 under PCT Article 21(2).

BACKGROUND

The invention relates to the field of power amplifiers for the transmission of digital signals of the type used, for example, for radio transmitters.

The power amplifiers function in the switched mode, as a result of which considerably higher efficiency is achieved in comparison to linear amplifiers. The savings in operating costs that can be achieved are of great significance, particularly in the case of high-power transmitters for radio operations in the long-wave, medium-wave and short-wave ranges.

SUMMARY

It is an aspect of the present invention to provide a method with which distortions and thus increased out-of-band radiations caused by direct component errors of an amplitude signal can be avoided in the case of power amplifiers that use the EER principle to transmit digital modulation signals.

In an embodiment, the present invention provides a method for controlling power amplifiers for digital transmission. The method includes: converting a digital modulation signal according to envelope elimination and restoration into an amplitude signal and into a phase-modulated carrier signal; combining the amplitude signal and the phase-modulated carrier signal in a final stage so as to provide a transmit signal; and automatically monitoring and correcting a direct component of the amplitude signal before a control of the final stage. The amplitude signal is automatically monitored by a module that employs a distribution-density function of the amplitude signal in order to determine a direct component error of the amplitude signal. The distribution-density function of the amplitude signal corresponds to a Rayleigh function if the energy of the complex modulation signal is distributed approximately uniformly within a bandwidth being used and if the spectral power density has an approximately rectangular form. The Rayleigh function is used to determine the direct component error. The direct component error is determined from the amplitude signal, which is derivable from the transmit signal by amplitude modulation.

BRIEF DESCRIPTION OF THE DRAWINGS

Aspects of the present invention will now be described by way of exemplary embodiments with reference to the following drawings, in which.

DETAILED DESCRIPTION

Figure 1:
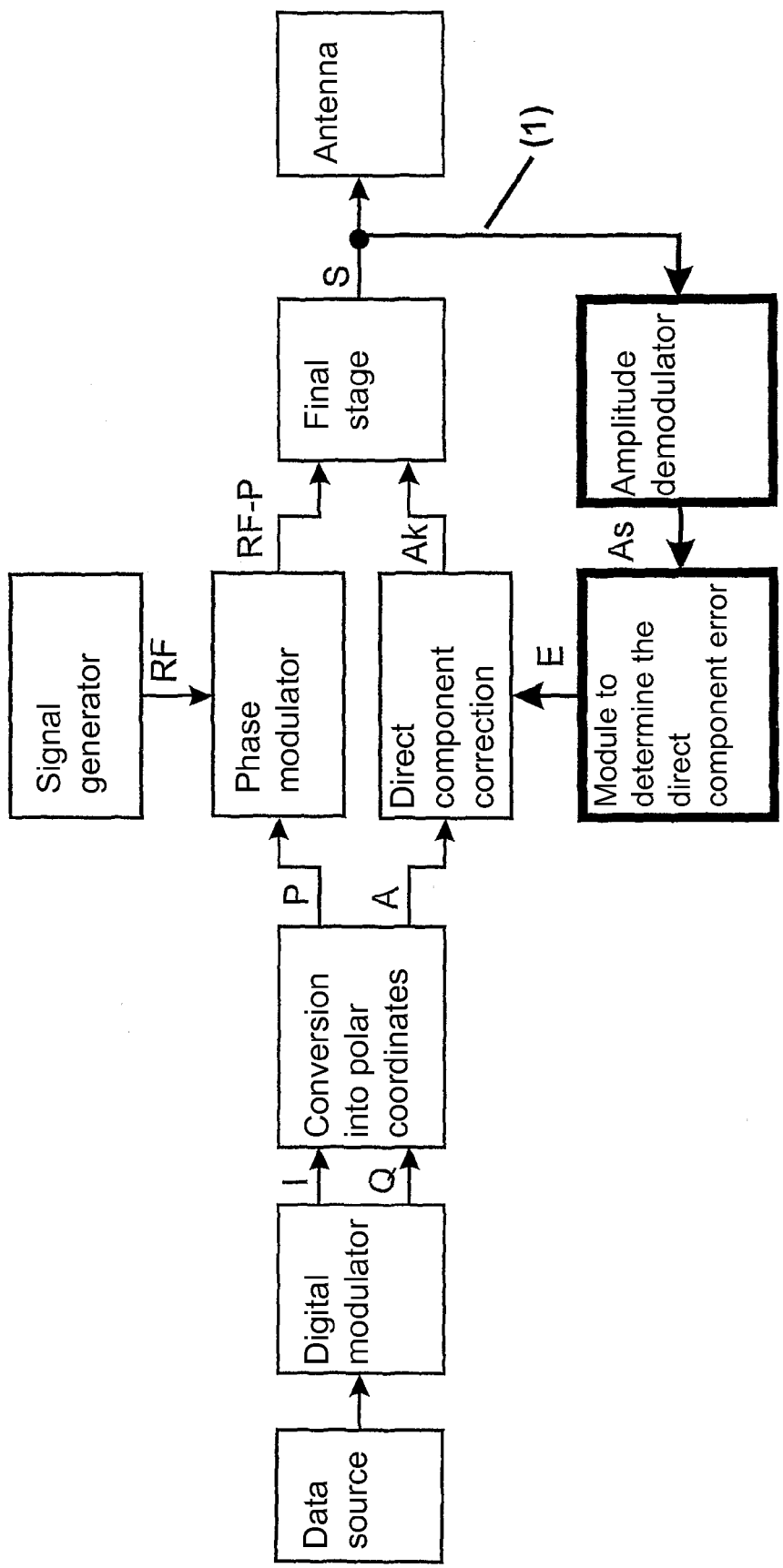
FIG. 1 is a flow diagram showing an example embodiment of the present invention.

In power amplifiers, a method of envelope elimination and restoration (EER) is employed for transmitting digital modulation signals. In this process, an amplitude component and a phase component are formed from the complex modulation signal by transformation (FIG. 1). The RF (radio frequency) carrier signal is modulated with the phase component. In the transmitter final stage, the amplitude signal and the phase-modulated carrier signal then undergo multiplicative combination to create the transmit signal [L. R. Kahn, "Single sideband transmission by envelope elimination and restoration", Poc. IRE, vol. 40, no. 7, pp. 803-806, July 1952].

The complex modulation signal generated by the digital modulator is limited to a given bandwidth. In order to be further processed in the amplifier, the modulation signal, which is present in Cartesian coordinates with a real component and an imaginary component or an inphase component and a quadrature phase component (I and Q), is transformed into a polar representation with amplitude and phase. In this process, the band-limited real component and imaginary component give rise to the amplitude signal (A) and the phase signal (P) with a theoretically infinite bandwidth. The carrier signal RF is modulated with the phase signal. Both signal components, i.e. the amplitude signal (A) and the phase-modulated carrier signal (RF-P) have to be processed in separate amplifier branches in such a manner that, after they have undergone multiplicative combination, a transmit signal is created in the final stage that corresponds to the digital modulation signal and that is limited in its bandwidth. The requirements made of the amplifier in terms of linearity and bandwidth are extremely high. Any small distortion in the amplifier causes a deviation of the transmit signal from the modulation signal and an increase in out-of-band radiations. The transmit signal is then no longer band-limited. This is especially critical for amplifiers that are used in the radio sector since interferences can occur in adjacent channels.

Experience acquired in actual practice during digital operations with these amplifiers has shown that especially the direct component of the amplitude signal exerts a great deal of influence on the level of out-of-band radiations. The entire signal-processing branch, from the output of the digital modulator all the way to the amplifier final stage, has to be permeable to the direct component of the amplitude signal.

After the amplitude signal has been converted from Cartesian into polar coordinates, it has a positive value range starting at 0. As a rule, power amplifiers in the radio sector require an amplitude signal that is symmetrical to 0 or 0V for control purposes. This means that control with an amplitude signal of 0V for these transmitters already leads to an output power of about 25% of the peak power. In order to prevent this, a negative signal level is added to the amplitude signal, thus correcting the direct component in such a way that the output power of the transmitter is 0 at an amplitude signal of 0V.

The level of the direct component, which has to be superimposed onto the amplitude signal, has to be determined with a special measuring technique (oscilloscope, spectrum analyzer) and with special measuring signals and then manually set for the direct component correction. When the direct component is being set, it is observed which effect the correction has on the out-of-band radiations. It is crucial here to have an extremely precise setting since even minimal errors lead to distortions and thus to a marked rise in the out-of-band radiations.

In view of the complicated measuring method, it is problematic to precisely set the direct component and especially to ensure that the set level corresponds to the conditions for optimal control for a prolonged period of time. For example, temperature-dependent fluctuations in the parameters of the employed elements can cause a shift in the operating points and thus changes in the direct component in the amplitude signal. This is why in actual operation, the direct component that has been set needs to be regularly checked and corrected. The precision of the manual measuring and setting method, however, is limited.

In an embodiment of the present invention a method allows optimal control of the power amplifier in that direct component errors of the amplitude signal are automatically detected and corrected. The direct component of the amplitude signal is computer-monitored by a module. If deviations occur, the direct component is automatically corrected in that the exact level value of the direct component error is superimposed onto the amplitude signal.

For purposes of determining the direct component error, the amplitude signal used is the one that can be derived from the transmit signal by amplitude modulation (1). The amplitude signal As is fed to a module that employs the distribution-density function of the amplitude signal in order to determine the direct component error (E). It is known that the distribution-density function of the amplitude values of a digital modulation signal corresponds to a Rayleigh function (FIG. 2) if the distribution density is determined over a sufficiently large time section of the signal and if the following conditions are met:

the energy of the complex modulation signal is distributed approximately uniformly within the bandwidth being used;

the spectral power density of the complex modulation signal has an approximately rectangular form.

As a rule, these conditions are met with digital modulation signals.

Figure 2:
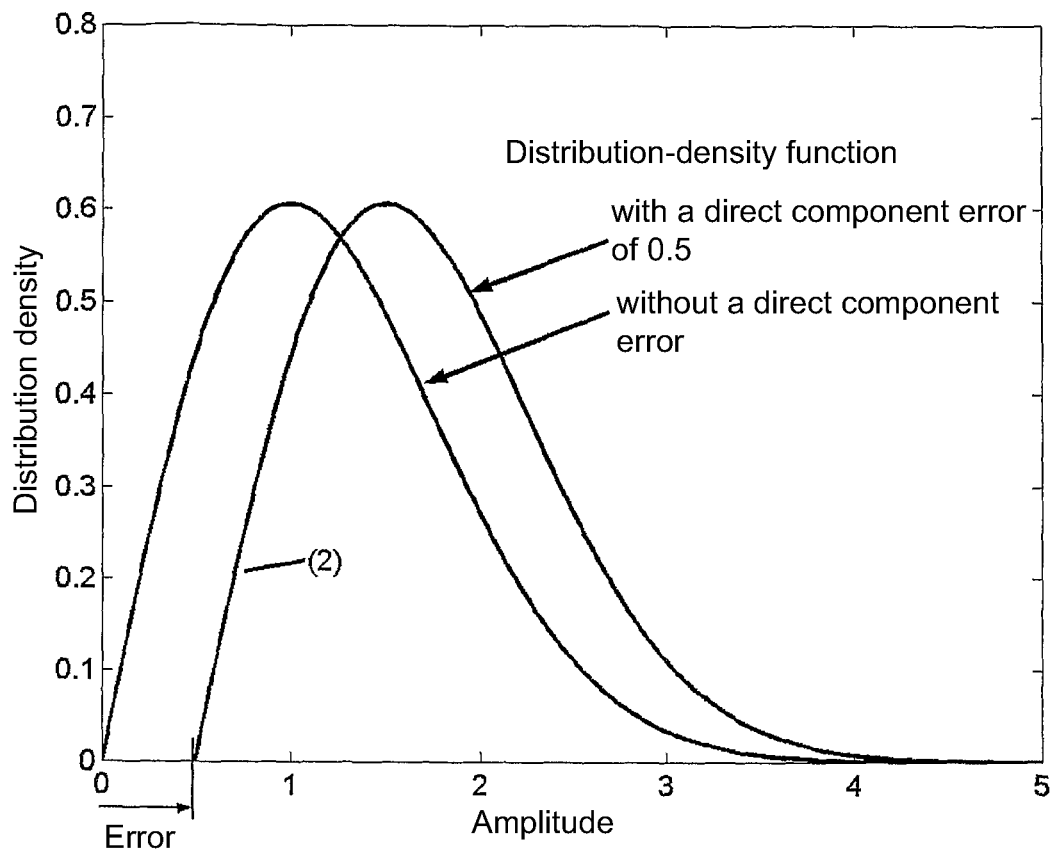
FIG. 2 is a graph showing a distribution density function with a direct component error of 0.5 and a distribution density function without a direct component error.

As shown in FIG. 2, the Rayleigh function starts at very small amplitudes with a value approximating 0 and then rises, as the amplitude increases, up to a maximum value. Afterwards, the function drops again and approximates the value of 0. If there is no direct component error, the distribution-density function of the measured signal As starts with 0 at small amplitudes and then rises uniformly. If there is a direct component error, the starting point for the distribution-density function shifts along the abscissa. The form of the Rayleigh function, however, is retained. Therefore, the direct component error can be directly determined from the starting point of the distribution-density function.

If the direct component error of the amplitude signal is positive, the starting point of the distribution-density function shifts towards positive values on the abscissa. Here, the direct component error corresponds precisely to the shift in the starting value of the Rayleigh function on the abscissa (2).

Figure 3:
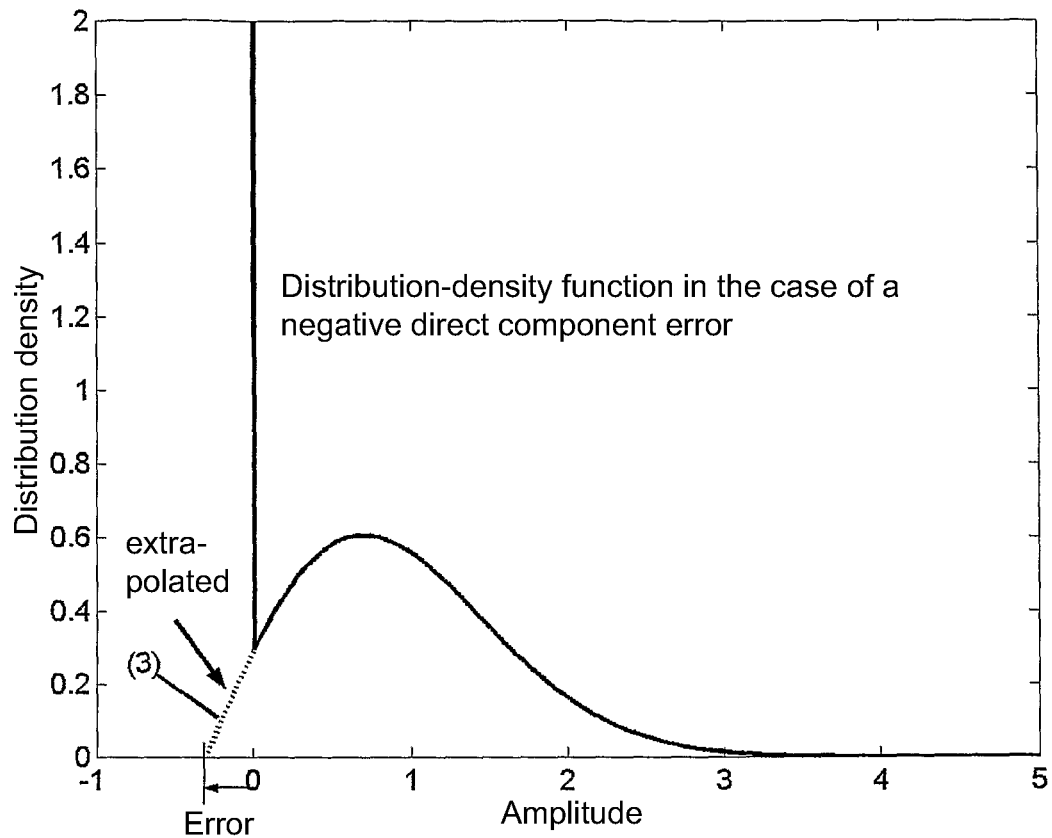
FIG. 3 is a graph showing a distribution density function in the case of a negative direct component error.

If the direct component error of the amplitude signal is negative, the amplifier is modulated too low. Since the amplifier cannot process negative amplitudes, these signals are limited to a minimum value. The power at the output of the amplifier is 0 in these cases. The distribution-density function of the amplitude signal at the amplitude output shifts in the negative direction. Due to the limitation of the amplifier, the distribution-density function rises very pronouncedly at the 0 position (FIG. 3). All of the signal components, which actually lie within the negative amplitude range, are added up at the value 0. The component of the distribution-density function that lies in the positive range still displays the form of a Rayleigh function. Since this form is known, the point of intersection with the abscissa and thus the direct component error can be determined through extrapolation into the negative range (3).

The direct component correction is automatically carried out in such a way that the exact level value of the determined direct-component deviation is added with the opposite sign to the amplitude signal prior to the control of the final stage.

LIST OF THE REFERENCE NUMERALS USED

I, Q inphase component, quadrature phase component
A amplitude signal
P phase signal
RF radio frequency (high-frequency carrier)
RF-P phase-modulated RF signal
Ak amplitude signal with corrected direct component
S transmit signal
As amplitude signal derived from the transmit signal
E direct component error

The invention claimed is:

1. A method for controlling power amplifiers for digital transmission, comprising:
    converting a digital modulation signal according to envelope elimination and restoration into an amplitude signal and into a phase-modulated carrier signal;
    combining the amplitude signal and the phase-modulated carrier signal in a final stage so as to provide a transmit signal; and
    automatically monitoring and correcting a direct component of the amplitude signal before a control of the final stage,
    wherein the amplitude signal is automatically monitored by a module that employs a distribution-density function of the amplitude signal in order to determine a direct component error of the amplitude signal;
    wherein the distribution-density function of the amplitude signal corresponds to a Rayleigh function;
    wherein the direct component error is determined from the amplitude signal based on an amount of shift of the Rayleigh function along the abscissa of a distribution density versus amplitude plot relative to a Rayleigh function having no direct component error on the distribution density versus amplitude plot, the amplitude signal being derivable from the transmit signal by amplitude modulation; and
    wherein:
    if the direct component error of the amplitude signal is positive, the magnitude of the direct component error is the shift in the Rayleigh function on the abscissa, and
        if the direct component error of the amplitude signal is negative, the magnitude of the direct component error is determined based on the shift in the Rayleigh function relative to an extrapolated point of intersection with a negative side of the abscissa.

2. The method according to claim 1, wherein the direct component error is corrected such that a signal having the level of the ascertained direct component, but with an opposite sign, is superimposed onto the amplitude signal.

* * * * *